(12) United States Patent
Jang

(10) Patent No.: US 12,490,418 B2
(45) Date of Patent: Dec. 2, 2025

(54) MAGNETIC FIELD SHIELDING MODULE FOR ELECTRIC VEHICLE, AND WIRELESS POWER TRANSMISSION MODULE INCLUDING SAME FOR ELECTRIC VEHICLE

(71) Applicant: AMOSENSE CO., LTD, Cheonan-si (KR)

(72) Inventor: Kil Jae Jang, Cheonan-si (KR)

(73) Assignee: AMOSENSE CO., LTD, Cheonan-si (KR)

( * ) Notice: Subject to any disclaimer, the term of this patent is extended or adjusted under 35 U.S.C. 154(b) by 0 days.

(21) Appl. No.: 18/705,471

(22) PCT Filed: Oct. 14, 2022

(86) PCT No.: PCT/KR2022/015654
§ 371 (c)(1),
(2) Date: Apr. 26, 2024

(87) PCT Pub. No.: WO2023/075243
PCT Pub. Date: May 4, 2023

(65) Prior Publication Data
US 2025/0008714 A1    Jan. 2, 2025

(30) Foreign Application Priority Data
Oct. 27, 2021    (KR) ........................ 10-2021-0144589

(51) Int. Cl.
*H05K 9/00*    (2006.01)
*B60L 53/12*    (2019.01)
(Continued)

(52) U.S. Cl.
CPC ............ *H05K 9/0075* (2013.01); *B60L 53/12* (2019.02); *H02J 50/10* (2016.02); *H02J 50/70* (2016.02)

(58) Field of Classification Search
CPC ........ H05K 9/0075; H05K 9/00; B60L 53/12; B60L 2270/147; H02J 50/10; H02J 50/70;
(Continued)

(56) References Cited

U.S. PATENT DOCUMENTS 11,962,161 B2 *    4/2024  Kim .................... H02J 50/005
2014/0049212 A1 *    2/2014  Sawa .................. H02J 7/00302
320/108

(Continued)

FOREIGN PATENT DOCUMENTS

JP    2010-41906 A    2/2010
KR    10-2013-0016588 A    2/2013
(Continued)

OTHER PUBLICATIONS

International Search Report for PCT/KR2022/015654 by Korean Intellectual Property Office dated Feb. 13, 2023.
Office Action for KR 10-2021-0144589 by Korean Intellectual Property Office dated Jul. 22, 2024.

*Primary Examiner* — Rexford N Barnie
*Assistant Examiner* — Michael J Warmflash
(74) *Attorney, Agent, or Firm* — BROADVIEW IP LAW, PC

(57) ABSTRACT

A magnetic field shielding module for an electric vehicle is provided. A magnetic field shielding module for an electric vehicle according to an embodiment of the present invention may comprise: a main shielding layer including a plurality of unit blocks made of a ferrite material to shield a magnetic field generated from a planar coil in which a conductive member is wound multiple times, the main shielding layer being formed in a plate shape having a predetermined area by the plurality of unit blocks arranged adjacent to each other; and an auxiliary shielding layer made of a magnetic material containing a metal component to supplement the main shielding layer, disposed on one surface of the main (Continued)

shielding layer, and including a penetrating portion formed in a shape corresponding to that of the planar coil.

18 Claims, 11 Drawing Sheets

(51) Int. Cl.
*H02J 50/10* (2016.01)
*H02J 50/70* (2016.01)

(58) Field of Classification Search
CPC .......... H01F 1/153; H01F 27/28; H01F 27/30; H01F 27/36; H01F 38/14; H01F 27/366; H01F 27/2804; H01F 27/306; Y02T 10/70; B60Y 2200/91
See application file for complete search history.

(56) References Cited

U.S. PATENT DOCUMENTS

| | | | |
|---|---|---|---|
| 2019/0107893 A1* | 4/2019 | Levesque | G06F 3/016 |
| 2022/0416574 A1* | 12/2022 | Kim | B60L 53/12 |

FOREIGN PATENT DOCUMENTS

| | | | | |
|---|---|---|---|---|
| KR | 10-2016-0100786 A | | 8/2016 | |
| KR | 20160100786 A | * | 8/2016 | .............. H02J 17/00 |
| KR | 10-2017-0018677 A | | 2/2017 | |
| KR | 20170018677 A | * | 2/2017 | ......... H01F 1/14791 |
| KR | 10-2019-0107893 A | | 9/2019 | |
| KR | 20190107893 A | * | 9/2019 | .............. H02J 50/70 |
| KR | 10-2020-0084545 A | | 7/2020 | |

* cited by examiner

MAGNETIC FIELD SHIELDING MODULE FOR ELECTRIC VEHICLE, AND WIRELESS POWER TRANSMISSION MODULE INCLUDING SAME FOR ELECTRIC VEHICLE

CROSS-REFERENCE TO RELATED APPLICATIONS

This application is a National Phase Entry Application of PCT Application No. PCT/KR2022/015654 filed on Oct. 14, 2022, which claims priority to Korean Patent Application No. 10-2021-0144589 filed on Oct. 27, 2021, in the Korean Intellectual Property Office, the entire contents of which are hereby incorporated by reference in its entirety.

TECHNICAL FIELD

The present disclosure relates to a magnetic field shielding module for an electric vehicle and a wireless power transfer module for an electric vehicle including the same.

BACKGROUND ART

Electric vehicles currently under development are using wireless charging technology to overcome limitations of batteries.

Such wireless charging is performed through a wireless power transfer module including a coil that wirelessly transmits or receives power supplied from the outside and a shielding sheet disposed on one surface of the coil to shield a magnetic field generated from the coil.

In this case, the shielding sheet used in the wireless power transfer module for vehicles is generally a magnetic sheet made of a ferrite material. However, the wireless power transfer module for vehicles such as electric vehicles has a large handling power and transfer distance compared to the wireless power transfer module for mobile, so the shielding sheet applied to the wireless power transfer module for vehicles is configured to have a large-area of 100 mm×100 mm or more while having a thickness of approximately 5 mm.

Accordingly, the conventional vehicle shielding sheet made of the ferrite material may satisfy the required power transmission efficiency, but has the disadvantage of having a large overall weight.

Accordingly, when the shielding sheet for vehicles is applied to electric vehicles, the batteries of electric vehicles can be easily charged using wireless power, but the electric vehicles have a problem in that the overall weight of the wireless power transfer module increases due to the weight of the shielding sheet, so the fuel efficiency is lowered.

DISCLOSURE

Technical Problem

The present disclosure has been devised in consideration of the above points, and it is an object of the present disclosure to provide a magnetic field shielding module for an electric vehicle which can reduce the overall weight while satisfying the required power transmission efficiency even if the shielding module for shielding a magnetic field is implemented in a large-area, and a wireless power transfer module for an electric vehicle including the same.

Another object of the present disclosure is to provide a magnetic field shielding module for an electric vehicle which can reduce the amount of heat generation by reducing loss due to eddy currents even if a sheet including a metallic component is included, and a wireless power transfer module including the same for an electric vehicle.

Moreover, still another object of the present disclosure is to provide a magnetic field shielding module for an electric vehicle which can enhance the mass production rate while the shielding module for shielding a magnetic field is implemented in a large-area, and a wireless power transfer module for an electric vehicle including the same.

Technical Solution

In order to solve the above-mentioned problems, the present disclosure provides a magnetic field shielding module for an electric vehicle, wherein the magnetic field shielding module is applied to a wireless power transfer module, and wherein the magnetic field shielding module comprising: a main shielding layer including a plurality of unit blocks made of a ferrite material to shield a magnetic field generated from a planar coil in which a conductive member is wound multiple times, wherein the main shielding layer is formed in a plate shape having a predetermined area by the plurality of unit blocks arranged adjacent to each other; and an auxiliary shielding layer made of a magnetic material containing a metal component and disposed on one surface of the main shielding layer to supplement the main shielding layer, and wherein the auxiliary shielding layer includes a penetrating portion formed through in a shape corresponding to that of the planar coil.

In addition, the magnetic field shielding module for the electric vehicle may further a coil accommodating groove formed to be recessed at a predetermined depth from one surface of the main shielding layer in a shape corresponding to the planar coil to receive the thickness of the planar coil.

In addition, at least some unit blocks among the plurality of unit blocks may include a unit accommodating groove for receiving a part of the planar coil, and the unit accommodating grooves formed in each of the at least some of the unit blocks may be connected to each other in a state in which the plurality of unit blocks are arranged to be adjacent to each other to form the coil accommodating groove having a shape corresponding to the planar coil.

In addition, the plurality of unit blocks may include a first unit block having a curved unit accommodating groove, a second unit block having a straight unit accommodating groove, and a third unit block having no unit accommodating groove.

In addition, the coil accommodating groove may be formed to be recessed from one surface of the main shielding layer to have a depth equal to or greater than the wire diameter of the conductive member.

In addition, the penetrating portion may be formed to have a narrower width than the planar coil.

In addition, the magnetic field shielding module for the electric vehicle may further include an auxiliary blocking member made of a magnetic material and disposed in the coil accommodating groove, wherein the auxiliary blocking member may include a plate-shaped support plate, a partition member extending from the support plate to a predetermined height and formed in a spiral shape, and a seating groove defined by the support plate and the partition member, and wherein the partition member may be disposed to be positioned between turns adjacent to each other in the planar coil.

In addition, the coil accommodating groove may be formed as an accommodating groove having both sides thereof sealed.

In addition, the main shielding layer may include a protruding portion extending from at least some of the unit blocks among the plurality of unit blocks by a predetermined length, and wherein the protruding portion may be inserted into the penetrating portion.

In addition, at least some of the unit blocks among the plurality of unit blocks may include unit protruding portions extending a predetermined length from a body to be inserted into the penetrating portion, and wherein the unit protruding portions formed in each of the at least some of the unit blocks may be connected to each other in a state in which the plurality of unit blocks are arranged to be adjacent to each other and have a shape corresponding to the penetrating portion.

In addition, the auxiliary shielding layer may be a ribbon sheet of an amorphous alloy or nanocrystalline alloy.

Meanwhile, the present disclosure provides a wireless power transfer module for electric vehicle, which includes a wireless power transfer antenna provided with a planar coil in which a conductive member is wound multiple times; and a magnetic field shielding module made of a magnetic material to shield a magnetic field generated from the planar coil, wherein the magnetic field shielding module may be a magnetic field shielding module for an electric vehicle described above.

Advantageous Effects

According to the present disclosure, even if the magnetic field shielding module is implemented in a large-area through a plurality of unit blocks arranged to be adjacent to each other, it is possible to satisfy the required power transmission efficiency and to reduce the weight.

In addition, according to the present disclosure, it is possible to reduce the amount of heat generated by reducing the loss due to eddy currents, thereby improving the wireless power transmission efficiency.

Furthermore, according to the present disclosure, it is possible to enhance the mass production rate even if the magnetic field shielding module is configured in a large-area.

MODES OF THE INVENTION

Figure 1:
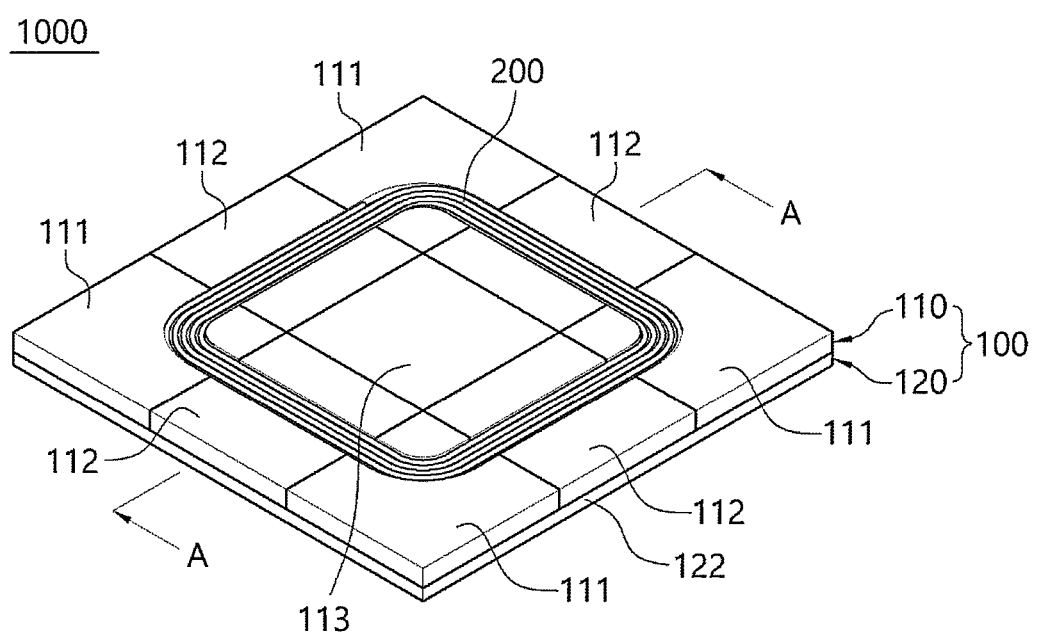
FIG. 1 is a view illustrating a wireless power transfer module for an electric vehicle according to an embodiment of the present disclosure.
Figure 2:
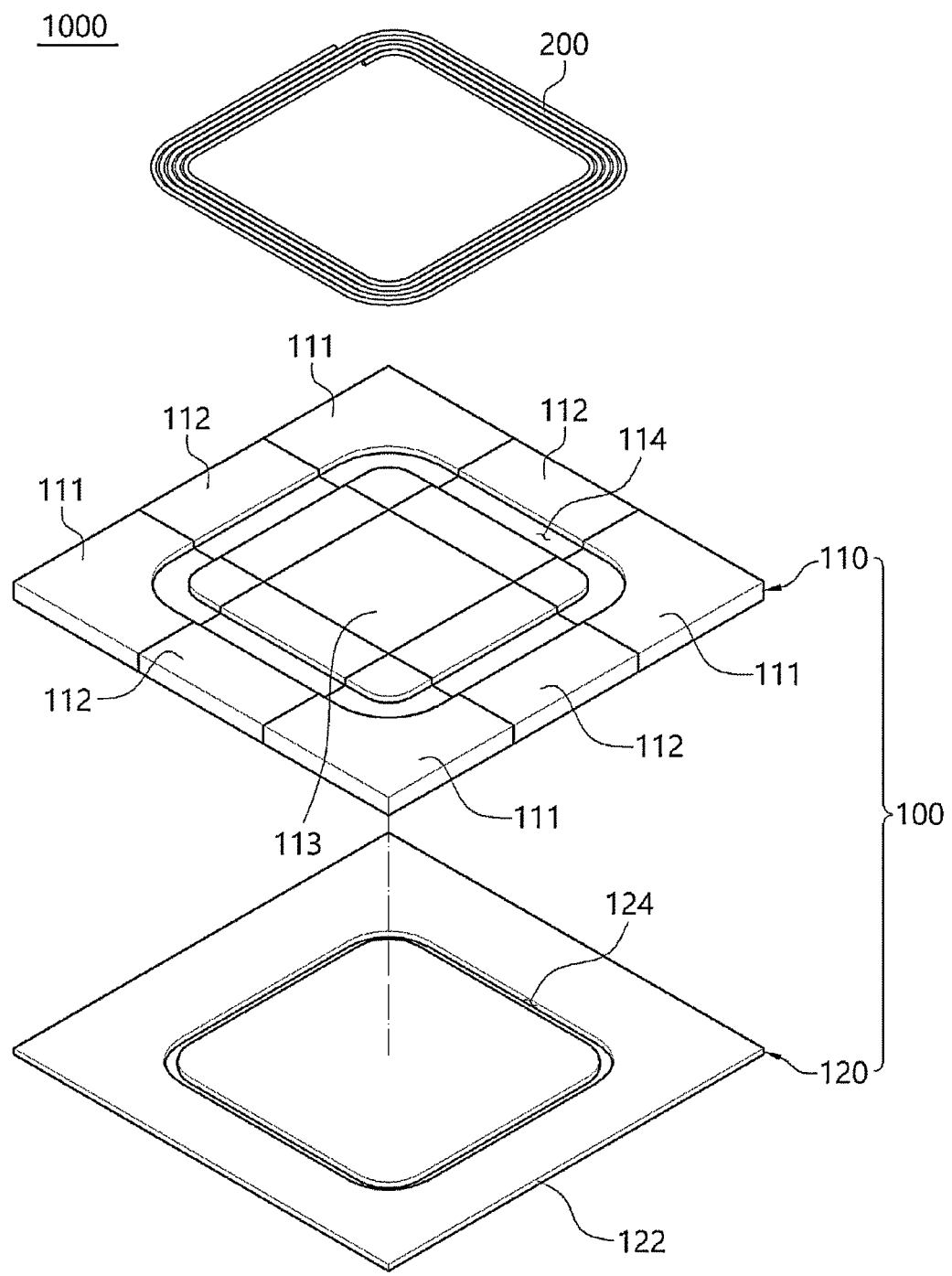
FIG. 2 is an exploded view of FIG. 1.
Figure 3:
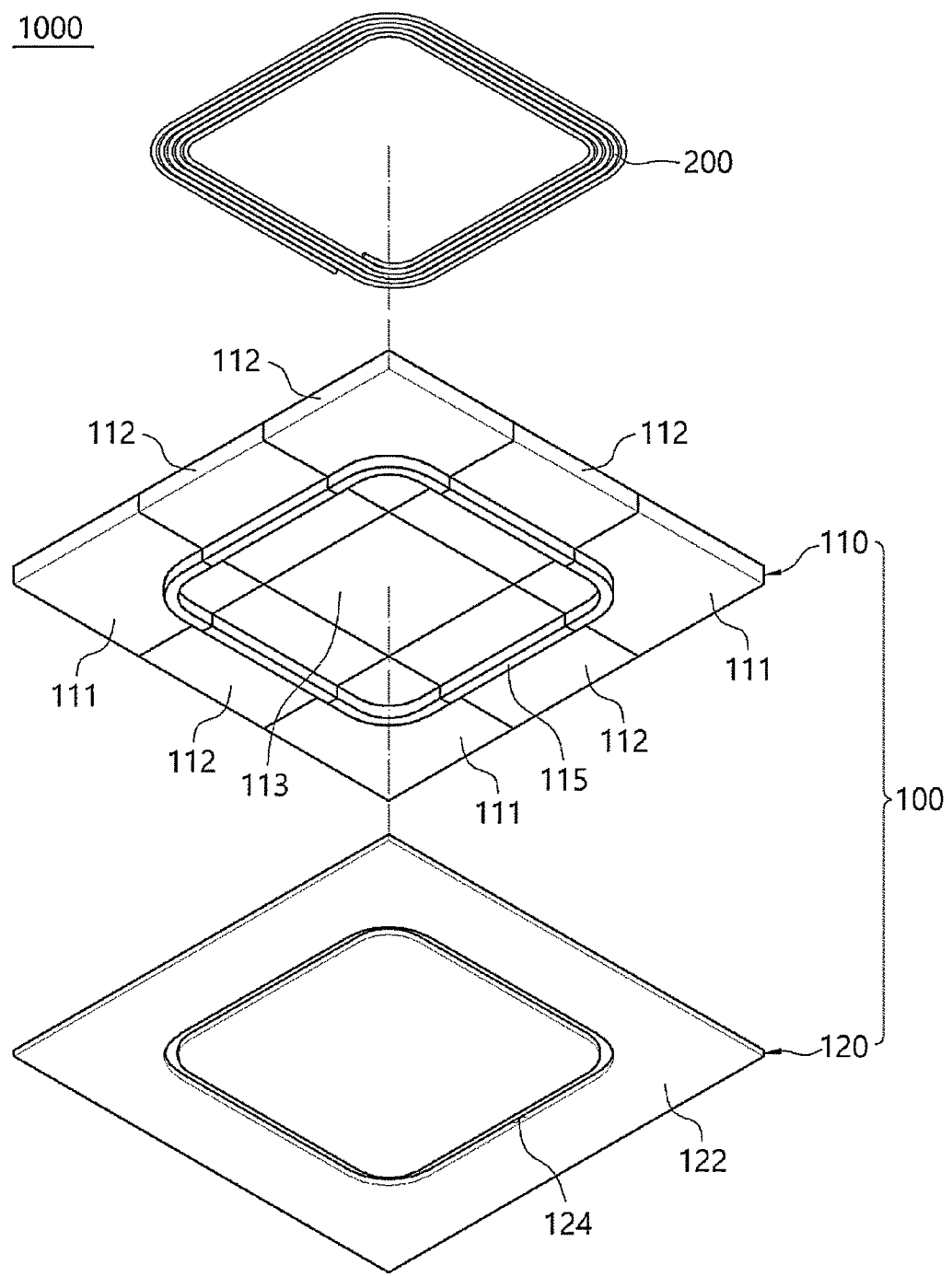
FIG. 3 is a view taken from the bottom of FIG. 2.

Hereinafter, embodiments of the present disclosure will be described in detail with reference to the accompanying drawings so that those skilled in the art can easily implement them. The present disclosure may be implemented in various different forms and is not limited to the embodiments described herein. In the drawings, in order to clearly explain the present disclosure, parts irrelevant to the description were omitted, and the same or similar components will be denoted by the same reference numerals throughout the entire specification.

Figure 11:
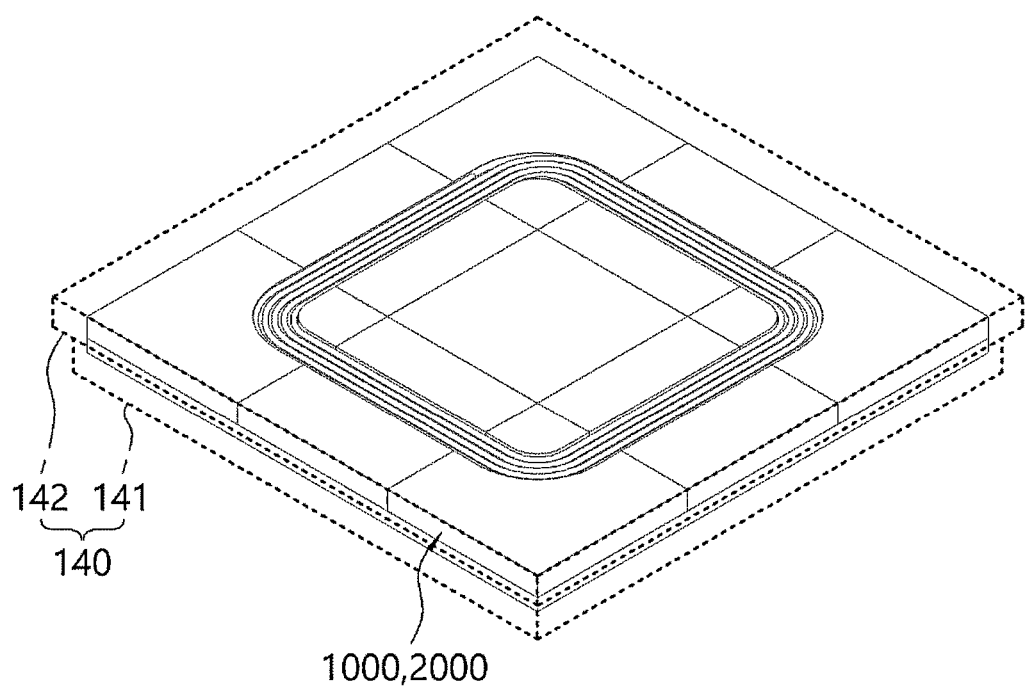
FIG. 11 is a view illustrating a state in which the wireless power transfer module for an electric vehicle according to an embodiment of the present disclosure is accommodated in a case.

Magnetic field shielding modules 100 and 100' for an electric vehicle according to an embodiment of the present disclosure may be applied to wireless power transfer modules 1000 and 2000 for the electric vehicle as illustrated in FIG. 11, and the wireless power transfer modules 1000 and 2000 for the electric vehicle may charge a battery of the electric vehicle.

Such magnetic field shielding modules 100 and 100' for the electric vehicle may be implemented with a large-area where at least one of a total width, a total length, and a diameter is 100 mm or more. For example, the magnetic field shielding modules 100 and 100' for the electric vehicle may have the total width and the total length of 100 mm or more, respectively, and may be implemented with a size of 400 mm×400 mm.

However, the total size of the magnetic field shielding modules 100 and 100' for the electric vehicle is not limited thereto, and when the size is 100 mm×100 mm or more or the diameter is 100 mm or more, they may be changed to various sizes according to design conditions.

In addition, the magnetic field shielding modules 100 and 100' for the electric vehicle according to an embodiment of the present disclosure may be applied to wireless power transmission modules for the electric vehicle to transmit wireless power to wireless power reception modules installed in the electric vehicle, or may be applied to the wireless power reception modules for the electric vehicle installed in the electric vehicle to receive wireless power transmitted from the wireless power transmission modules for the electric vehicle.

In this case, even if the magnetic field shielding modules 100 and 100' for the electric vehicle according to an embodiment of the present disclosure may be implemented in a large-area of 100 mm×100 mm or more, the magnetic field shielding modules 100 and 100' for the electric vehicle according to an embodiment of the present disclosure may satisfy the required power transmission efficiency and reduce the total weight, reduce the amount of heat generation by reducing the loss due to eddy currents, and increase the mass productivity while being implemented in a large-area.

To this end, the magnetic field shielding modules 100 and 100' for the electric vehicle according to an embodiment of the present disclosure may include a main shielding layer 110 and an auxiliary shielding layer 120 as illustrated in FIGS. 1 to 8, and the auxiliary shielding layer 120 may be disposed on one surface of the main shielding layer 110.

That is, the magnetic field shielding modules 100 and 100' for the electric vehicle according to an embodiment of the present disclosure may include the main shielding layer 110 for shielding a magnetic field generated from a planar coil 200 and the auxiliary shielding layer 120 that may reduce the entire thickness by supplementing the main shielding layer 110, and wherein the planar coil 200 and the auxiliary shielding layer 120 may be disposed on upper and lower surfaces that are opposite each other relative to the main shielding layer 110.

Specifically, the main shielding layer 110 may include a plurality of unit blocks 111, 112, and 113 made of ferrite material to shield a magnetic field generated from the planar coil 200, and the plurality of unit blocks 111, 112, and 113 may be arranged such that one side thereof is adjacent to each other.

In the present disclosure, each of the unit blocks 111, 112, and 113 may be sintered through a firing process after pressurizing a ferrite powder, and the unit blocks 111, 112, and 113 may be made of Ni—Zn ferrite or Mn—Zn ferrite, but may be made of Mn—Zn ferrite to exhibit relatively excellent performance in a frequency band of 100 to 350 kHz.

Figure 9:
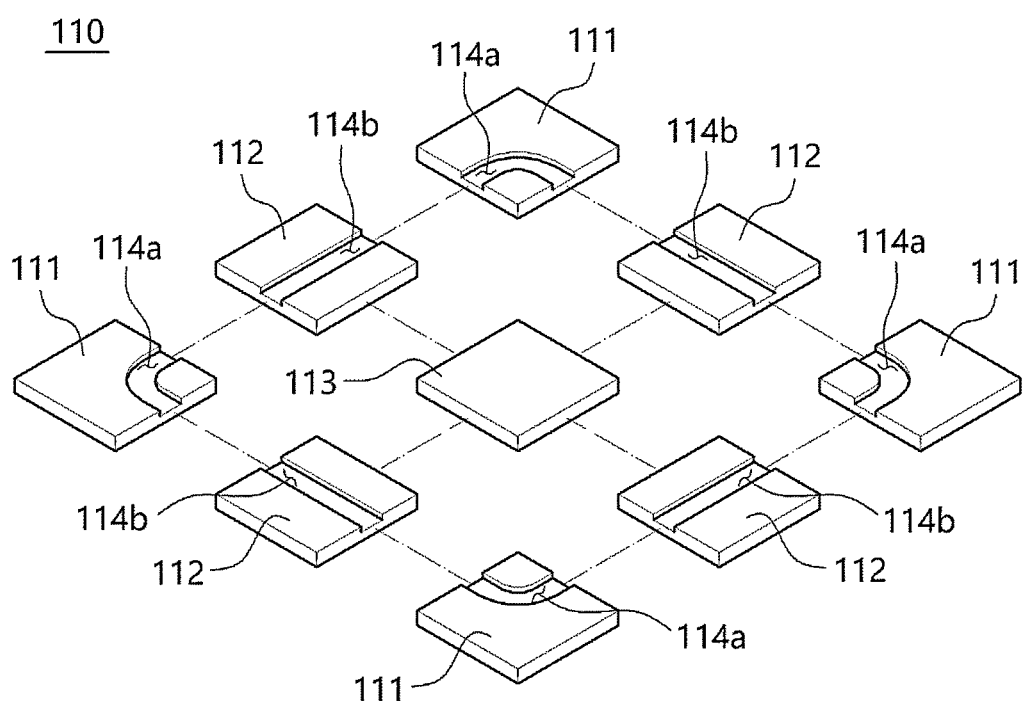
FIG. 9 is a view showing the separation of a plurality of unit blocks constituting the main shielding layer applied in FIG. 1 and FIG. 5.
Figure 10:
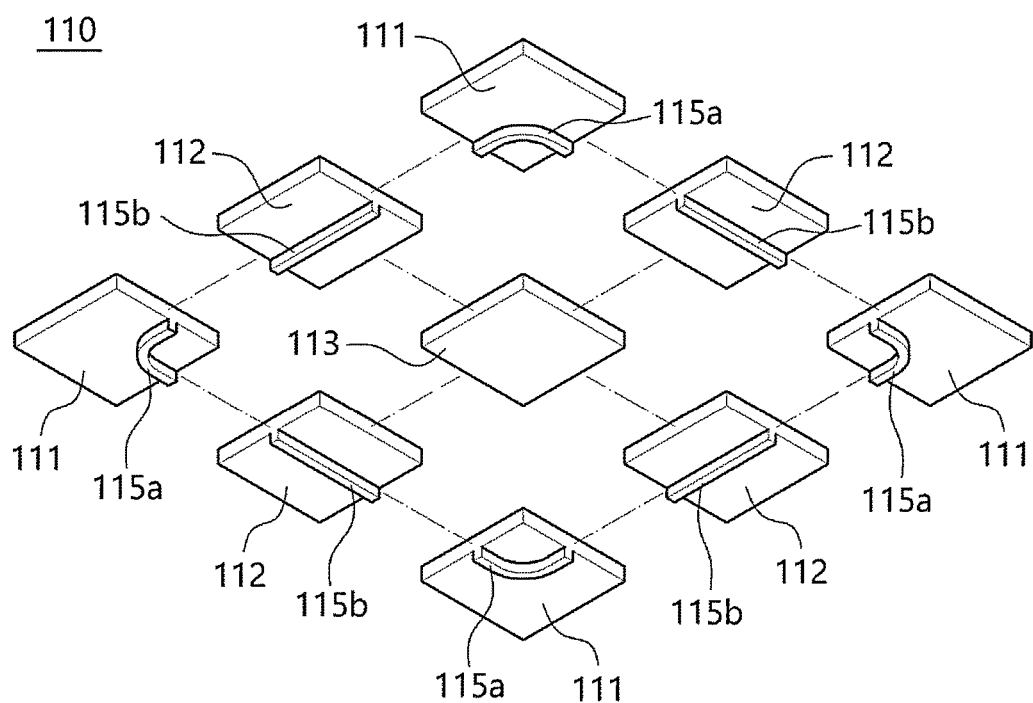
FIG. 10 is a view taken from the bottom of FIG. 9.

A plurality of such unit blocks 111, 112, and 113 may be provided, separated from each other, as illustrated in FIGS. 9, and 10, and the plurality of unit blocks 111, 112, and 113 may be arranged such that one side thereof is adjacent to each other to form a plate-shaped main shielding layer 110 having a predetermined area.

Accordingly, in the magnetic field shielding modules 100 and 100' for the electric vehicle according to an embodiment of the present disclosure, the main shielding layer 110 may be implemented in a large-area having a size of 100 mm×100 mm or more or a diameter of 100 mm or more by appropriately arranging the plurality of unit blocks 111, 112, and 113.

Herein, the plurality of unit blocks 111, 112, and 113 may be arranged in a matrix structure of m×n (m, n are natural numbers, respectively), and may have the same size or different sizes.

The auxiliary shielding layer 120 may be disposed on one surface of the main shielding layer 110, and may supplement the function of the main shielding layer 110.

To this end, the auxiliary shielding layer 120 may be a plate-shaped magnetic sheet 122 having a predetermined area, and may be provided to have a larger size or larger area than the unit blocks 111, 112, and 113 constituting the main shielding layer 110.

Accordingly, the magnetic field shielding modules 100 and 100' for the electric vehicle according to an embodiment of the present disclosure may block a leaked magnetic field through the auxiliary shielding layer 120 even if the magnetic field is leaked through a gap formed between the neighboring unit blocks 111, 112, and 113.

Thus, the magnetic field shielding modules 100 and 100' for the electric vehicle according to an embodiment of the present disclosure may improve the shielding performance by reducing the amount of leakage of the magnetic field leaked between the unit blocks 111, 112, and 113 constituting the main shielding layer 110.

In this case, the auxiliary shielding layer 120 may be formed of a material having high magnetic permeability and high saturation magnetic flux density.

For example, the magnetic sheet 122 constituting the auxiliary shielding layer 120 may be a ribbon sheet of an amorphous alloy or nanocrystalline alloy, and the ribbon sheet may be a plate-shaped sheet to achieve high magnetic permeability, but may be a sheet formed separated into multiple pieces to reduce loss due to eddy currents.

In addition, the magnetic sheet 122 may be a multi-layer sheet in which a plurality of ribbon sheets 122a are stacked in multiple layers with an adhesive layer 122b as the medium.

Figure 4:
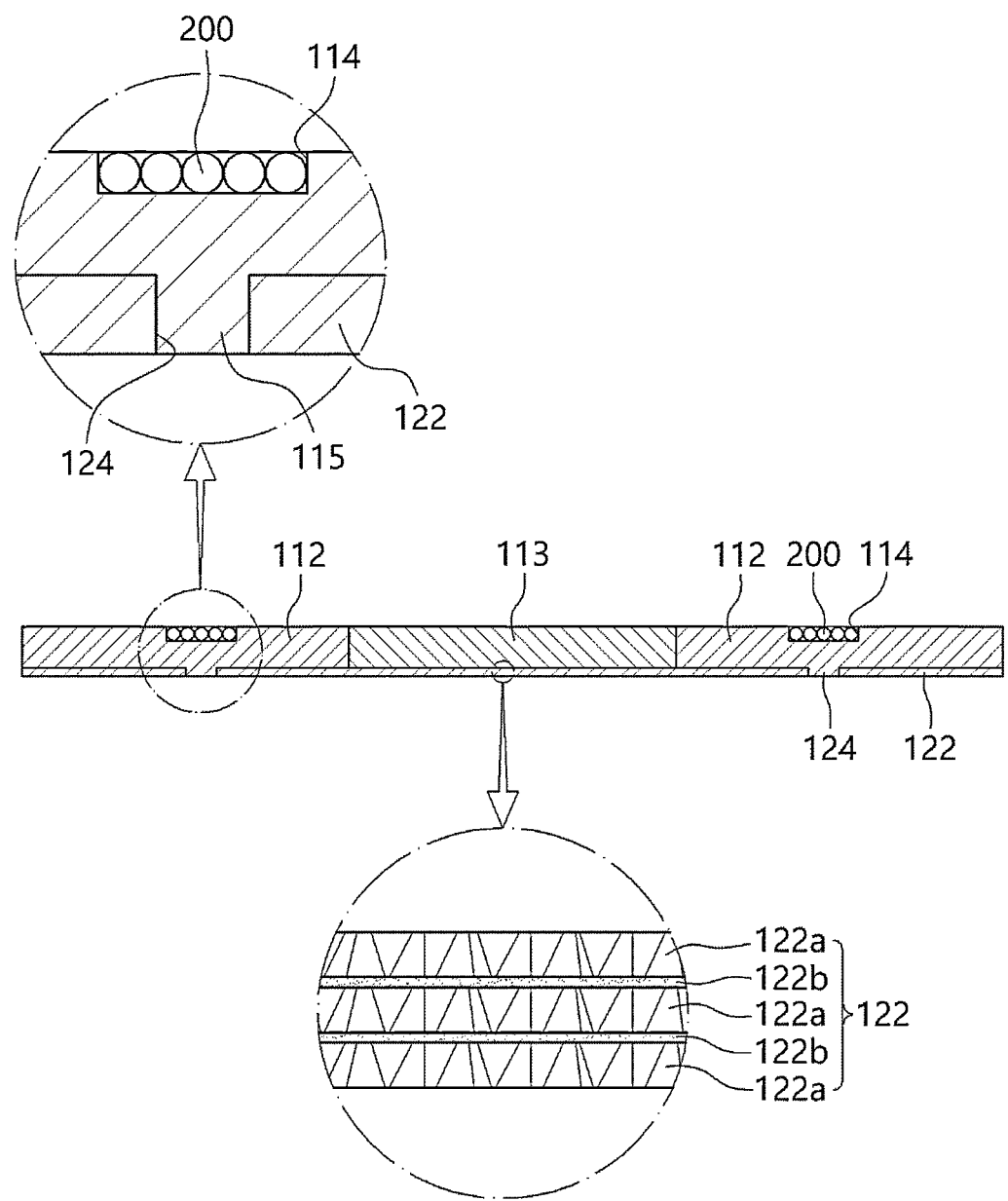
FIG. 4 is a cross-sectional view taken along line A-A of FIG. 1.
Figure 5:
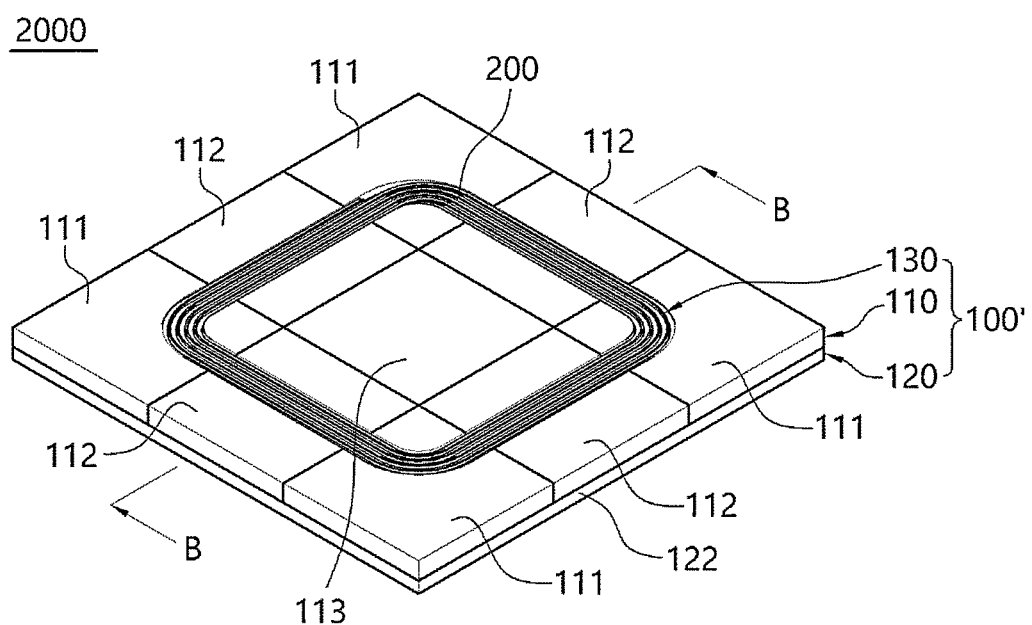
FIG. 5 is a view illustrating a wireless power transfer module for an electric vehicle according to another embodiment of the present disclosure.
Figure 6:
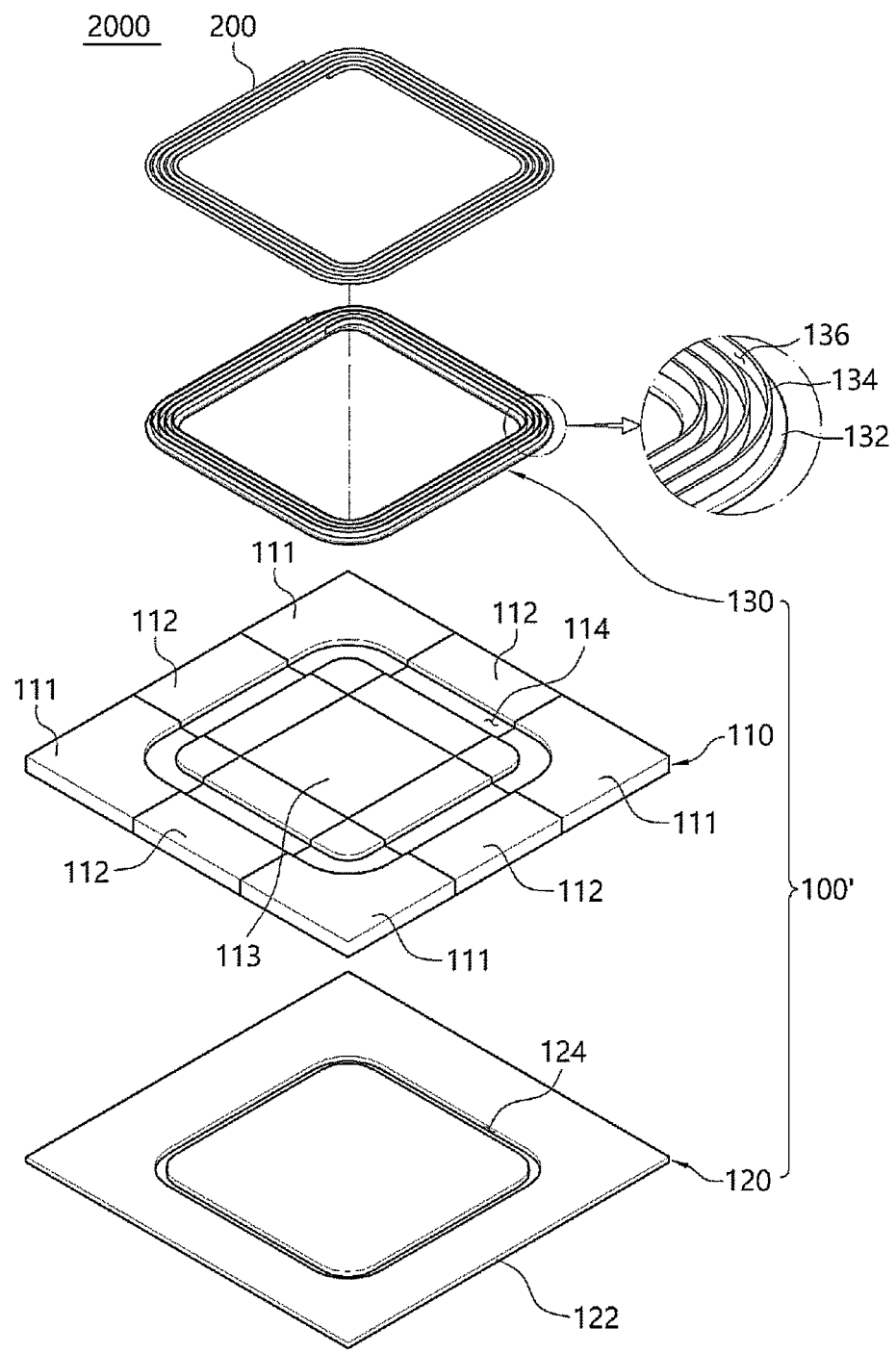
FIG. 6 is an exploded view of FIG. 5.
Figure 7:
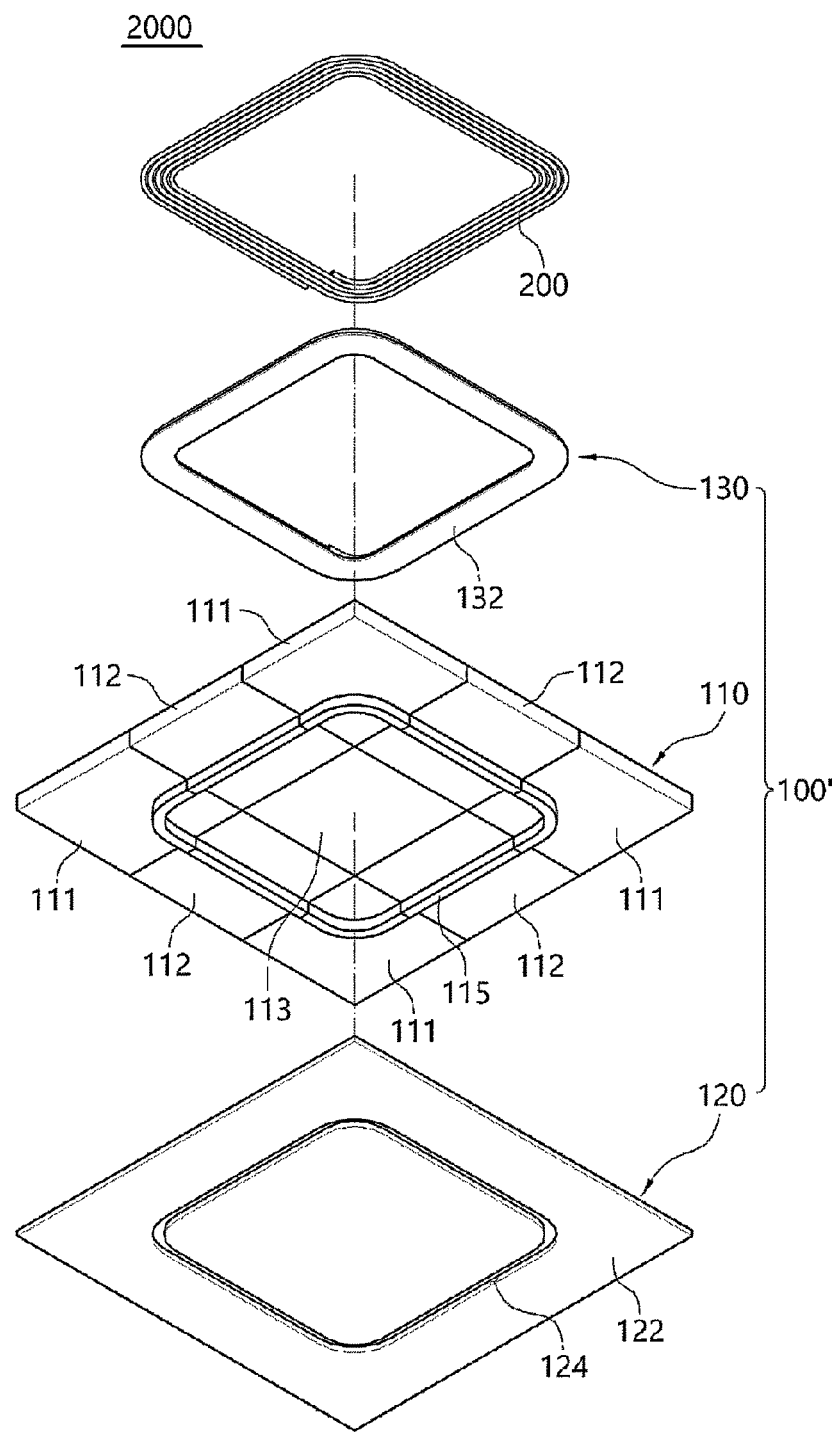
FIG. 7 is a view taken from the bottom of FIG. 6.
Figure 8:
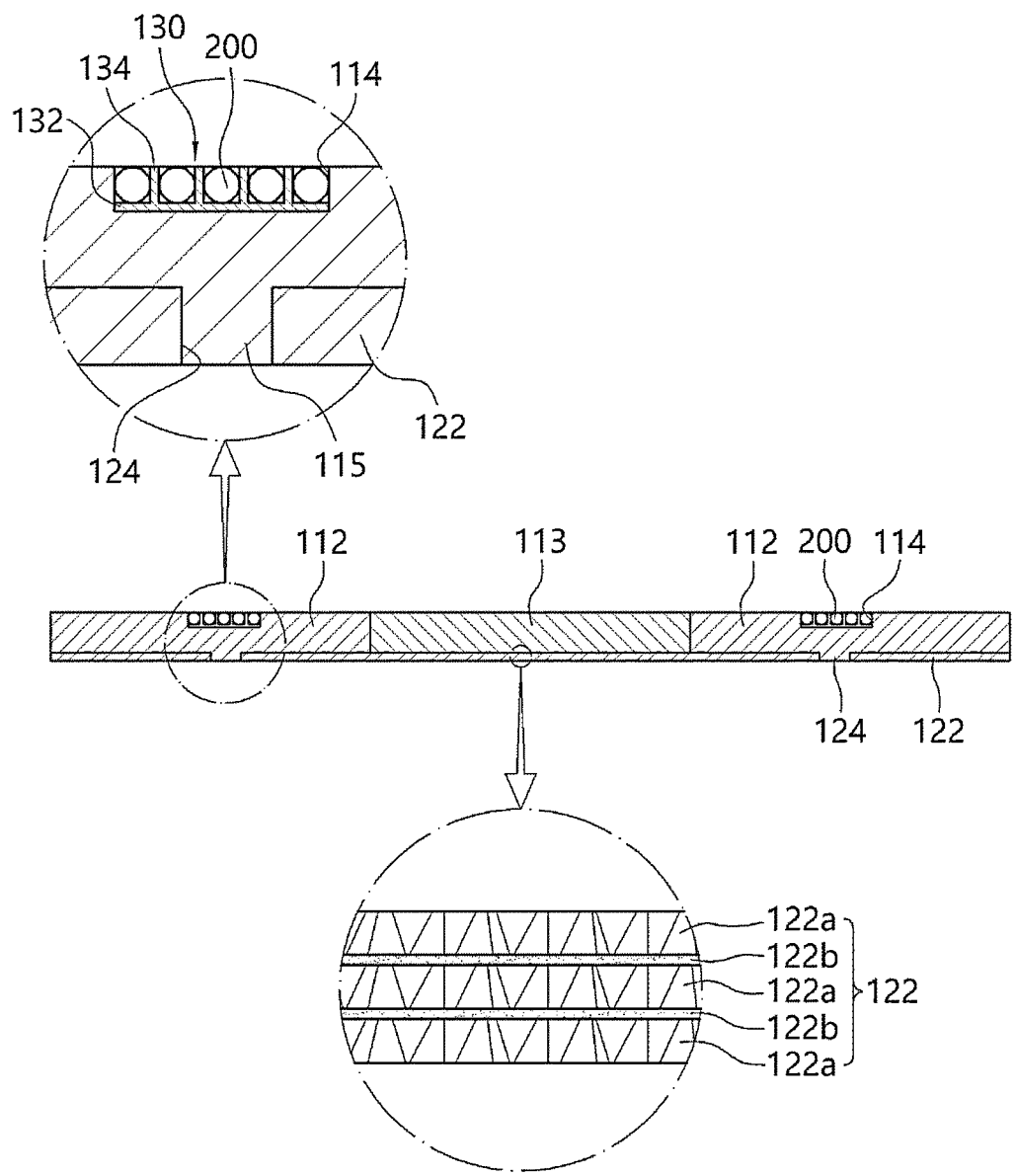
FIG. 8 is a cross-sectional view taken along line B-B of FIG. 5.

That is, the magnetic sheet 122 may be a ribbon sheet separated into a plurality of pieces through flake treatment as illustrated in FIGS. 4, and 8, and the magnetic sheet 122 may be a multilayer sheet in which the plurality of ribbon sheets are stacked in multiple layers.

Through this, the magnetic field shielding modules 100 and 100' for the electric vehicle according to an embodiment of the present disclosure may improve the overall shielding performance by supplementing the main shielding layer 110 through the auxiliary shielding layer 120 implemented with a very thin thickness, and thus reduce the thickness of the unit blocks 111, 112, and 113 constituting the main shielding layer.

Accordingly, even if the magnetic field shielding modules 100 and 100' for the electric vehicle according to an embodiment of the present disclosure include an auxiliary shielding layer 120 having a thin thickness, the entire thickness may be thin and the entire weight may be light. However, the material of the magnetic sheet 122 constituting the auxiliary shielding layer 120 is not limited thereto, and any material capable of shielding the magnetic field leaking from the main shielding layer 110 may be used without limitation.

In this case, the magnetic field shielding modules 100 and 100' for the electric vehicle according to an embodiment of the present disclosure may include a coil accommodating groove 114 for receiving the flat plate-shaped coil 200, and the coil accommodating groove 114 may be an accommodating groove formed at a predetermined depth from one surface of the main shielding layer 110 in a shape corresponding to the flat plate-shaped coil 200.

In this case, at least some the unit blocks 111 and 112 among the plurality of unit blocks 111, 112, and 113 constituting the main shielding layer 110 may include unit accommodating grooves 114a, and 114b for receiving a prat of the flat plate-shaped coil 200, and the coil accommodating groove 114 may be formed through the unit blocks 111, and 112 having the unit accommodating grooves 114a, and 114b.

That is, the unit accommodating grooves 114a, and 114b respectively formed in at least some of the unit blocks 111, and 112 may be connected to each other to form the coil accommodating groove 114 having a shape corresponding to the flat plate-shaped coil 200.

For example, the plurality of unit blocks 111, 112, and 113 may include a first unit block 111 having a curved unit accommodating groove 114a formed on one surface thereof, a second unit block 112 having a straight unit accommodating groove 114b formed on one surface thereof, and a third unit block 113 having no unit accommodating grooves 114a, and 114b.

Accordingly, when the first unit block 111, the second unit block 112, and the third unit block 113 are appropriately combined and arranged such that one side thereof is adjacent to each other, the main shielding layer 110 may be implemented in a large-area having a size of 100 mm×100 mm or more or a diameter of 100 mm or more, and the coil accommodating groove 114 may have a shape corresponding to the flat plate-shaped coil 200 by being connected the curved unit accommodating groove 114a formed in the first unit block and the straight unit accommodating groove 114b formed in the second unit block 112.

Accordingly, when the first unit block 111, the second unit block 112, and the third unit block 113 are appropriately combined, the magnetic field shielding modules 100 and 100' for the electric vehicle according to an embodiment of the present disclosure may have a large-area having a size of 100 mm×100 mm or more or a diameter of 100 mm or more, and may constitute the main shielding layer 110 having the coil accommodating groove 114 formed on one surface thereof for accommodating the flat plate-shaped coil 200.

However, the unit blocks 111, 112, and 113 for constituting the main shielding layer 110 are not limited to the above-described first unit block 111, the second unit block 112, and the third unit block 113, and the shape of the unit accommodating grooves 114a, and 114b of the first unit block 111 and the second unit block 112 for constituting the main shielding layer 110 may be appropriately changed depending on the size or shape of the flat plate-shaped coil 200, and at least any one of the first unit block 111, the second unit 112, and the third unit 113 may not be used to constitute the main shielding layer 110 according to the size or shape of the flat plate-shaped coil 200.

In this case, at least one of the first unit block 111, second unit block 112, and third unit block 113 may be provided in plural numbers.

For example, when the main shielding layer 110 is composed of nine unit blocks 111, 112, and 113, four first unit blocks 111 and four second unit blocks 112 may be used, and one third unit block 113 may be used.

In this case, when four first unit blocks 111 and four second unit blocks 112 and one third unit block 113 are connected to each other, the magnetic field shielding modules 100 and 100' for the electric vehicle according to an embodiment of the present disclosure may constitute the main shielding layer 110 having a coil accommodating groove 114 formed in a closed loop shape of approximately a quadrangle on one surface.

Accordingly, the magnetic field shielding modules 100, and 100' for electric vehicles according to an embodiment of the present disclosure may minimize the types of unit blocks 111, 112, and 113 used to constitute the main shielding layer 110, thereby minimizing the number of molds for producing the unit blocks 111, 112, and 113.

Through this, even if the main shielding layer 110 is composed of the plurality of unit blocks 111, 112, and 113 and includes the coil accommodating groove 114 corresponding to the planar coil 200 on one surface of the main shielding layer 110 composed of the plurality of unit blocks 111, 112, and 113, the magnetic field shielding modules 100, and 100' for the electric vehicle according to an embodiment of the present disclosure may constitute the main shielding layer 110 including the coil accommodating groove 114 using a minimum mold, thereby minimizing the increase in production costs and maintaining the mass productivity.

In addition, the magnetic field shielding modules 100, and 100' for the electric vehicle according to an embodiment of the present disclosure may increase productivity and mass production by simply increasing the size of the coil accommodating groove 114 and the total area of the main shielding layer 110 by appropriately combining the above-described unit blocks 111, 112, and 113.

However, the total number of unit blocks 111, 112, and 113 for constituting the main shielding layer is not limited thereto, and the total number of unit blocks 111, 112, and 113 may be appropriately changed according to the total area of the main shielding layer.

In this case, the unit accommodating grooves 114a, and 114b for forming the coil accommodating groove 114 may be accommodating grooves formed into a predetermined depth from one surface of the unit blocks 111, 112, and 113 so that both sides thereof are sealed. In addition, the unit accommodating grooves 114a, and 114b may be formed to have a depth that is the same as the wire diameter or thickness of the conductive member constituting the planar coil 200 or has a depth larger than the wire diameter or thickness of the conductive member.

Accordingly, when the planar coil 200 is inserted into the coil accommodating groove 114 formed by being connected the unit accommodating grooves 114a, and 114b, the planar coil 200 may be disposed in the coil accommodating groove 114 so as not to protrude outward from one surface of the main shielding layer 110.

That is, when the planar coil 200 is inserted into the coil accommodating groove 114, the planar coil 200 may be surrounded by the bottom surface and both sides of the coil accommodating groove 114.

For this reason, in the magnetic field shielding modules 100 and 100' for the electric vehicle according to an embodiment of the present disclosure, the planar coil 200 inserted into the coil accommodating groove 114 may improve the concentration of the magnetic field, thereby improving wireless power transmission efficiency.

Accordingly, the magnetic field shielding modules 100 and 100' for the electric vehicle according to an embodiment of the present disclosure may realize wireless power transmission efficiency equal to or more than a conventional level even if the thickness of the main shielding layer 110 is thinner, thereby reducing the total weight as much as corresponding to the thinned thickness.

In other words, the magnetic field shielding modules 100, and 100' for the electric vehicle according to an embodiment of the present disclosure may supplement the shielding performance of the main shielding layer 110 through the auxiliary shielding layer 120 and the coil accommodating groove 114 so that even if the thickness of the main shielding layer 110 is thinner, the wireless power transmission efficiency may be implemented at a level equal to or greater than the conventional level, and the total weight may be further reduced by the thinned thickness of the main shielding layer 110.

Meanwhile, the magnetic field shielding module 100' for the electric vehicle according to an embodiment of the present disclosure may further include an auxiliary blocking member 130 disposed in the coil accommodating groove 114 as illustrated in FIGS. 5 to 8.

The auxiliary blocking member 130 may be made of a magnetic material to shield a magnetic field generated by the planar coil 200.

Through this, the auxiliary blocking member 130 may further increase the power transmission efficiency of the planar coil 200 by preventing leakage of a magnetic field generated from the planar coil 200.

In this case, the auxiliary blocking member 130 may be disposed so that a portion of the auxiliary blocking member 130 is positioned between turns adjacent to each other in the planar coil 200 inserted into the coil accommodating groove 114.

To this end, the auxiliary blocking member 130 may include a plate-shaped support plate 132, a partition member 134 extending from the support plate 132 to a predetermined height and formed in a spiral shape, and a seating groove 136 defined by the support plate 132 and the partition member 134.

Accordingly, the seating grooves 136 partitioned from each other by the partition members 134 along the width direction of the coil accommodating groove 114 may be arranged in a row, and the plurality of seating grooves 136 may be formed in a spiral shape connected to one like the partition members 134.

Through this, the conductive member forming a coil body in the planar coil 200 may be inserted along the seating groove 136, and the conductive member inserted along the seating groove 136 may form the coil body in a form that is wound multiple times in one direction.

Accordingly, the partition member 134 may be disposed to be positioned between turns adjacent to each other in the planar coil 200, and the conductive member inserted into the seating groove 136 may be surrounded on both sides by the partition members 134 or by the side surfaces of the partition member 134 and the coil accommodating groove 114.

Through this, the magnetic field shielding module 100' for the electric vehicle according to an embodiment of the present disclosure may more effectively prevent a magnetic field generated from the planar coil 200 from being leaked.

Herein, the auxiliary blocking member 130 may be made of a polymer material such as sandust to easily form the partition member 134 in a spiral shape, although all known magnetic materials used for shielding a magnetic field may be used.

Meanwhile, the magnetic field shielding modules 100, and 100' for the electric vehicle according to an embodiment of the present disclosure may include a penetrating portion 124 formed through the auxiliary shielding layer 120 in a shape corresponding to the planar coil 200.

When the planar coil 200 is disposed on one surface of the main shielding layer 110, the penetrating portion 124 may be formed to be positioned directly below the coil body in which the conductive member is wound several times in the planar coil 200.

For example, when the main shielding layer 110 includes the coil accommodating groove 114, the penetrating portion 124 may be formed to be located at a position corresponding to the coil accommodating groove 114 in the auxiliary shielding layer 120.

Accordingly, the magnetic field shielding modules 100, and 100' for the electric vehicle according to an embodiment of the present disclosure may reduce loss due to eddy currents by forming the penetrating portion 124 directly below the coil body in which a magnetic field generated from the planar coil 200 is concentrated.

Therefore, the magnetic field shielding modules 100, and 100' for the electric vehicle according to an embodiment of the present disclosure may reduce the amount of heat generated by reducing the loss due to eddy currents even if the auxiliary shielding layer 120 for supplementing the main shielding layer 110 is composed of a large-area magnetic sheet 122 including a metal component.

That is, as described above, even if the auxiliary shielding layer 120 is composed of a ribbon sheet of an amorphous alloy or a nanocrystalline alloy and the ribbon sheet is separately formed into a plurality of pieces to reduce the loss due to eddy currents, the loss of eddy currents due to the area may be increased when the ribbon sheet is formed in a size of 100 mm×100 mm or more or a large-area of 100 mm or more in diameter.

To solve this problem, in the present disclosure, the penetrating portion 124 is formed to be located directly below the planar coil 200 in the auxiliary shielding layer 120, thereby reducing the loss of eddy currents due to the large-area.

Through this, the magnetic field shielding modules 100, and 100' for the electric vehicle according to an embodiment of the present disclosure may prevent performance degradation of the planar coil 200 due to heat generation, thereby realizing excellent power transmission efficiency.

In this case, the penetrating portion 124 may be formed to have a narrower width than the planar coil 200. That is, the penetrating portion 124 may be formed to have a width narrower than the width of the coil accommodating groove 114.

Through this, even if the auxiliary shielding layer 120 includes the penetrating portion 124, the auxiliary shielding layer 120 may reduce the loss of eddy currents through the penetrating portion 124 while minimizing deterioration of shielding performance of the magnetic field by the penetrating portion 124.

Meanwhile, in the magnetic field shielding modules 100, and 100' for the electric vehicle according to an embodiment of the present disclosure, the main shielding layer 110 may include a protruding portion 115 inserted into the penetrating portion 124 formed in the auxiliary shielding layer 120.

The protruding portion 115 may compensate for leakage of a magnetic field generated from the planar coil 200 through the penetrating portion 124 formed through the auxiliary shielding layer 120 to reduce loss due to eddy currents.

To this end, the protruding portion 115 may extend a predetermined length from at least some of the unit blocks 111, and 112 among the plurality of unit blocks 111, 112, and 113 constituting the main shielding layer 110.

For example, at least some of the unit blocks 111, and 112 among the plurality of unit blocks 111, 112, and 113 may include unit protruding portions 115a, and 115b extending a predetermined length from the body to be inserted into the penetrating portion 124, and the unit protruding portions 115a, and 115b formed in the at least some of the unit blocks 111, and 112 may be connected to each other to have a shape corresponding to the penetrating portion 124.

That is, the unit protruding portions 115a, and 115b formed in the at least some unit blocks 111, and 112 may be connected to each other to form the protruding portion 115 having a shape corresponding to the penetrating portion 124.

For example, as illustrated in FIG. 10, the plurality of unit blocks 111, 112, and 113 may include a first unit block 111 having a curved unit protrusion portion 115a formed on one surface thereof, a second unit block 112 having a straight unit protrusion portion 115b formed on one surface thereof, and a third unit block 113 having no unit protrusion portions 115a, and 115b formed thereon.

Accordingly, when the first unit block 111, the second unit block 112, and the third unit block 113 are appropriately combined and arranged such that one side is adjacent to each other, the main shielding layer 110 may be implemented in a large-area having a size of 100 mm×100 mm or more or a diameter of 100 mm or more, and the protruding portion 115 may have a shape corresponding to the penetrating portion 124 by being connected the curved unit protruding portion 115a formed in the first unit block 111 and the straight unit protruding portion 115b formed in the second unit block 112.

Therefore, when the first unit block 111, the second unit block 112, and the third unit block 113 are appropriately combined, the magnetic field shielding modules 100, and 100' for the electric vehicle according to an embodiment of the present disclosure may have a large-area having a size of 100 mm×100 mm or more or a diameter of 100 mm or more, and may constitute the main shielding layer 110 having the protruding portion 115 formed on one surface thereof in a shape corresponding to the penetrating portion 124.

However, the unit blocks 111, 112, and 113 for constituting the main shielding layer 110 are not limited to the first unit block 111, the second unit block 112, and the third unit block 113, and the first unit block 111 and the second unit block 112 for constituting the main shielding layer 110 may have the shapes of the unit protruding portions 115a, and 115b appropriately changed according to the size or shape of the penetrating portion 124, and at least one of the first unit block 111, the second unit block 112, and the third unit block 113 may not be used to constitute the main shielding layer 110 according to the size or shape of the penetrating portion 124.

In addition, as described above, when the main shielding layer 110 includes a coil accommodating groove 114 formed into and formed at a predetermined depth on one surface, the first unit block 111 and the second unit block 112 may have unit accommodating grooves 114a, and 114b formed on the upper surface of the body and unit protruding portions 115a, and 115b formed on the lower surface of the body, and the unit accommodating grooves 114a, and 114b formed in the upper surface of the body and the unit protruding portions 115a, and 115b formed in the lower surface of the body may have the same shape.

Therefore, when the first unit block 111, the second unit block 112, and the third unit block 113 are appropriately combined, the magnetic field shielding modules 100, and 100' for the electric vehicle according to an embodiment of the present disclosure may constitute the main shielding layer 110 in which the coil accommodating groove 114 of a shape corresponding to the planar coil 200 is formed on one surface thereof and the protruding portion 115 of a shape corresponding to the penetrating portion 124 is formed on the other surface thereof while having a large-area of a size of 100 mm×100 mm or more or a diameter of 100 mm or more.

Meanwhile, the above-described magnetic field shielding modules 100 and 100' for the electric vehicle may be implemented as wireless power transfer modules 1000 and 2000 for the electric vehicle to charge the battery of the electric vehicle.

As an example, the wireless power transfer modules 1000 and 2000 for the electric vehicle may include at least one wireless power transfer antenna for receiving or transmitting power using a magnetic field of a predetermined frequency band, and magnetic field shielding modules 100 and 100' for shielding a magnetic field generated from the wireless power transfer antenna, as illustrated in FIGS. 1 to 8, and the magnetic field shielding module may be the magnetic field shielding modules 100 and 100' for the electric vehicle described above.

Herein, the wireless power transfer antenna may be a planar coil 200 in which the conductive member is wound multiple times, and the planar coil 200 may be inserted into a coil accommodating groove 114 formed on one surface of the magnetic field shielding modules 100 and 100' for the electric vehicle.

Since the magnetic field shielding modules 100 and 100' for the electric vehicle are the same as those described above, detailed descriptions will be omitted.

In addition, when the planar coil 200 transmits wireless power to the outside, the wireless power transfer modules 1000 and 2000 for the electric vehicle may serve as wireless power transmission modules, and when the planar coil 200 receives wireless power, the wireless power transfer modules 1000 and 2000 for the electric vehicle may serve as wireless power reception modules.

That is, the wireless power transfer modules 1000 and 2000 for the electric vehicle may be implemented as wireless power transmission modules or wireless power reception modules according to the role of the planar coil 200.

In addition, the above-described wireless power transfer modules 1000 and 2000 for the electric vehicle may further include a separate case 140 for accommodating the planar coil 200 and the magnetic field shielding modules 100 and 100' as illustrated in FIG. 11.

For example, the case 140 may include a box-shaped main body 141 having an inner space to accommodate the planar coil 200 and the magnetic field shielding modules 100 and 100' therein, and a cover 142 covering an opened upper portion of the main body 141.

Although the present disclosure has been described above, the spirit of the present disclosure is not limited to the embodiments presented in this specification, and those skilled in the art understanding the spirit of the present disclosure can easily propose other embodiments within the same scope of the spirit of the present disclosure by adding, changing, deleting, and adding components, but this is also within the scope of the present disclosure.

The invention claimed is:

1. A magnetic field shielding module for an electric vehicle, wherein the magnetic field shielding module is applied to a wireless power transfer module, and
the magnetic field shielding module comprising:
a main shielding layer including a plurality of unit blocks made of a ferrite material to shield a magnetic field generated from a planar coil in which a conductive member is wound multiple times, wherein the main shielding layer is formed in a plate shape having a predetermined area by the plurality of unit blocks arranged adjacent to each other;
an auxiliary shielding layer made of a magnetic material containing a metal component and disposed on one surface of the main shielding layer to supplement the main shielding layer, and wherein the auxiliary shielding layer includes a penetrating portion formed through in a shape corresponding to that of the planar coil; and
wherein the main shielding layer comprises a protruding portion extending from at least some of the unit blocks among the plurality of unit blocks by a predetermined length, and
wherein the protruding portion is inserted into the penetrating portion.

2. The magnetic field shielding module for the electric vehicle of claim 1, wherein the magnetic field shielding module further comprises:
a coil accommodating groove formed to be recessed at a predetermined depth from one surface of the main shielding layer in a shape corresponding to the planar coil to receive the thickness of the planar coil.

3. The magnetic field shielding module for the electric vehicle of claim 2, wherein at least some unit blocks among the plurality of unit blocks comprise a unit accommodating groove for receiving a part of the planar coil,
wherein the unit accommodating grooves formed in each of the at least some of the unit blocks are connected to each other in a state in which the plurality of unit blocks are arranged to be adjacent to each other to form the coil accommodating groove having a shape corresponding to the planar coil.

4. The magnetic field shielding module for the electric vehicle of claim 2, wherein the plurality of unit blocks comprise:

a first unit block having a curved unit accommodating groove, a second unit block having a straight unit accommodating groove, and a third unit block having no unit accommodating groove.

5. The magnetic field shielding module for the electric vehicle of claim 2, wherein the coil accommodating groove is formed to be recessed from one surface of the main shielding layer to have a depth equal to or greater than the wire diameter of the conductive member.

6. The magnetic field shielding module for the electric vehicle of claim 2, wherein the magnetic field shielding module further comprises:

an auxiliary blocking member made of a magnetic material and disposed in the coil accommodating groove, wherein the auxiliary blocking member comprises:

a plate-shaped support plate, a partition member extending from the support plate to a predetermined height and formed in a spiral shape, and a seating groove defined by the support plate and the partition member, and wherein the partition member is disposed to be positioned between turns adjacent to each other in the planar coil.

7. The magnetic field shielding module for the electric vehicle of claim 2, wherein the coil accommodating groove is formed as an accommodating groove having both sides thereof sealed.

8. The magnetic field shielding module for the electric vehicle of claim 1, wherein the penetrating portion is formed to have a narrower width than the planar coil.

9. The magnetic field shielding module for the electric vehicle of claim 1, wherein at least some of the unit blocks among the plurality of unit blocks comprise unit protruding portions extending from a body at a predetermined length to be inserted into the penetrating portion, wherein the unit protruding portions formed in each of the at least some of the unit blocks are connected to each other in a state in which the plurality of unit blocks are arranged to be adjacent to each other and have a shape corresponding to the penetrating portion.

10. The magnetic field shielding module for the electric vehicle of claim 1, wherein the auxiliary shielding layer is a ribbon sheet of an amorphous alloy or nanocrystalline alloy.

11. A wireless power transfer module for an electric vehicle, comprising:

a wireless power transfer antenna provided with a planar coil in which a conductive member is wound multiple times; and a magnetic field shielding module made of a magnetic material to shield a magnetic field generated from the planar coil, wherein the magnetic field shielding module is a magnetic field shielding module for an electric vehicle according to claim 1.

12. The wireless power transfer module for the electric vehicle of claim 11, wherein the magnetic field shielding module further comprises:

a coil accommodating groove formed to be recessed at a predetermined depth from one surface of the main shielding layer in a shape corresponding to the planar coil to receive the thickness of the planar coil.

13. The wireless power transfer module for the electric vehicle of claim 12, wherein at least some unit blocks among the plurality of unit blocks comprise a unit accommodating groove for receiving a part of the planar coil, wherein the unit accommodating grooves formed in each of the at least some of the unit blocks are connected to each other in a state in which the plurality of unit blocks are arranged to be adjacent to each other to form the coil accommodating groove having a shape corresponding to the planar coil.

14. The wireless power transfer module for the electric vehicle of claim 12, wherein the plurality of unit blocks comprise:

a first unit block having a curved unit accommodating groove, a second unit block having a straight unit accommodating groove, and a third unit block having no unit accommodating groove.

15. The wireless power transfer module for the electric vehicle of claim 12, wherein the magnetic field shielding module further comprises:

an auxiliary blocking member made of a magnetic material and disposed in the coil accommodating groove, wherein the auxiliary blocking member comprises:

a plate-shaped support plate, a partition member extending from the support plate to a predetermined height and formed in a spiral shape, and a seating groove defined by the support plate and the partition member, and wherein the partition member is disposed to be positioned between turns adjacent to each other in the planar coil.

16. The wireless power transfer module for the electric vehicle of claim 12, wherein the coil accommodating groove is formed as an accommodating groove having both sides thereof sealed.

17. The wireless power transfer module for the electric vehicle of claim 11 wherein the penetrating portion is formed to have a narrower width than the planar coil.

18. The wireless power transfer module for the electric vehicle of claim 11, wherein at least some of the unit blocks among the plurality of unit blocks comprise unit protruding portions extending from a body at a predetermined length to be inserted into the penetrating portion, wherein the unit protruding portions formed in each of the at least some of the unit blocks are connected to each other in a state in which the plurality of unit blocks are arranged to be adjacent to each other and have a shape corresponding to the penetrating portion.

* * * * *